US009001875B1

(12) United States Patent
Smaini et al.

(10) Patent No.: US 9,001,875 B1
(45) Date of Patent: *Apr. 7, 2015

(54) ON-CHIP I-Q IMBALANCE AND LO LEAKAGE CALIBRATION FOR TRANSCEIVERS

(71) Applicant: Marvell International Ltd., Hamilton (BM)

(72) Inventors: Lydi Smaini, Savigny (CH); Neric Fong, Santa Clara, CA (US); Sang Won Son, Palo Alto, CA (US); Bo Wang, San Diego, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/052,117

(22) Filed: Oct. 11, 2013

Related U.S. Application Data

(63) Continuation of application No. 13/611,808, filed on Sep. 12, 2012, now Pat. No. 8,559,488, which is a continuation of application No. 12/975,024, filed on Dec. 21, 2010, now Pat. No. 8,284,824, which is a continuation of application No. 11/942,473, filed on Nov. 19, 2007, now Pat. No. 7,856,048.

(60) Provisional application No. 60/866,501, filed on Nov. 20, 2006.

(51) Int. Cl.
H04B 1/38 (2006.01)
H04B 1/40 (2006.01)

(52) U.S. Cl.
CPC ........................................ H04B 1/40 (2013.01)

(58) Field of Classification Search
USPC .................................. 375/224, 219, 259, 296
See application file for complete search history.

(56) References Cited

U.S. PATENT DOCUMENTS

| 5,623,226 | A | 4/1997 | Whitmarsh et al. |
| 5,732,333 | A | 3/1998 | Cox et al. |
| 5,920,808 | A | 7/1999 | Jones et al. |
| 7,280,805 | B2 | 10/2007 | Xu et al. |
| 7,471,736 | B2 | 12/2008 | Ding et al. |
| 7,539,268 | B2 | 5/2009 | Fechtel |
| 7,782,928 | B2 | 8/2010 | Kang et al. |
| 7,822,147 | B2 | 10/2010 | Huang et al. |
| 7,856,050 | B1 | 12/2010 | Wiss et al. |
| 8,135,055 | B2 | 3/2012 | Kohlmann |
| 2004/0165678 | A1 | 8/2004 | Nadiri |
| 2005/0018787 | A1 | 1/2005 | Saed |

(Continued)

OTHER PUBLICATIONS

Glas, "Digital I/Q Imbalance in a Low-IF Receiver," IEEE Global Communications Conference, 1998.

*Primary Examiner* — Eva Puente

(57) ABSTRACT

The disclosure can provide methods and systems for autocalibrating a transceiver. The method can include upconverting a bandpass input signal by mixing the bandpass input signal with a first local oscillator signal to form an initial transmitter signal. The initial transmitter signal can be looped back to a receiver and downconverted with a second local oscillator signal having a frequency that is different from the first local oscillator to form an intermediate frequency signal. At least one of a gain and a phase of the transmitter can be adjusted based on a transmitter image sideband of the intermediate frequency signal to generate a calibrated transmitter signal having minimized transmitter image sideband.

20 Claims, 8 Drawing Sheets

(56) References Cited

U.S. PATENT DOCUMENTS

| | | |
|---|---|---|
| 2006/0223457 A1 | 10/2006 | Rahman |
| 2006/0291549 A1 | 12/2006 | Seppinen et al. |
| 2007/0211808 A1 | 9/2007 | Kang et al. |
| 2010/0022208 A1 | 1/2010 | Cole et al. |
| 2010/0197250 A1 | 8/2010 | Jung et al. |
| 2011/0013724 A1* | 1/2011 | Metreaud et al. ............ 375/296 |
| 2011/0069767 A1 | 3/2011 | Zhu |
| 2011/0116558 A1* | 5/2011 | Otaka et al. .................. 375/259 |
| 2011/0158297 A1* | 6/2011 | Ding et al. .................... 375/219 |
| 2011/0182335 A1* | 7/2011 | Pratt et al. .................... 375/224 |
| 2011/0218755 A1 | 9/2011 | Dhayni |
| 2012/0039375 A1 | 2/2012 | Eitel |
| 2012/0039457 A1 | 2/2012 | Liao et al. |
| 2012/0099673 A1 | 4/2012 | Johansson |

* cited by examiner

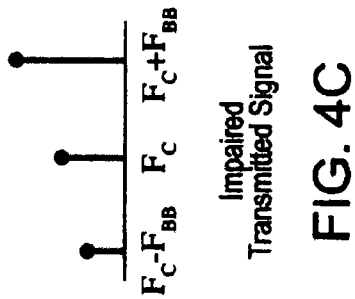
FIG. 4A Baseband Test Signal
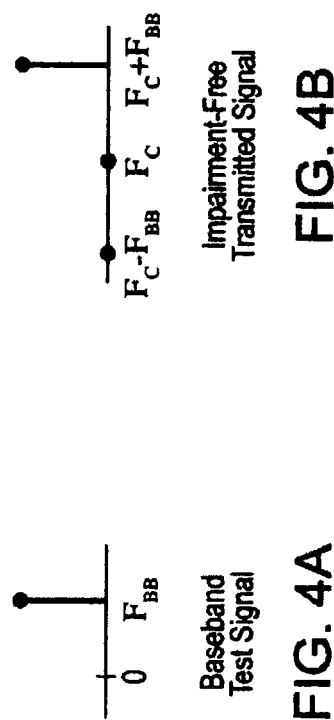
FIG. 4B Impairment-Free Transmitted Signal
FIG. 4C Impaired Transmitted Signal
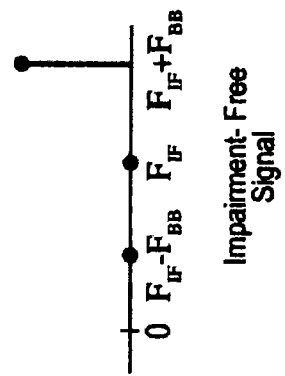
FIG. 4E Impairment-Free Signal
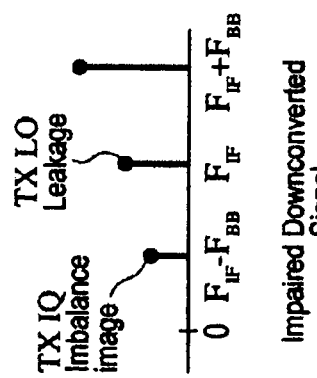
FIG. 4D Impaired Downconverted Signal Baseband Test Signal Impairment-Free Transmitted Signal Impaired Downconverted Signal Impairment-Free Downconverted Signal

ON-CHIP I-Q IMBALANCE AND LO LEAKAGE CALIBRATION FOR TRANSCEIVERS

INCORPORATION BY REFERENCE

This is a Continuation of application Ser. No. 13/611,808, filed on Sep. 12, 2012, which issued as U.S. Pat. No. 8,559,488 on Oct. 15, 2013, which is a Continuation of application Ser. No. 12/975,024. filed Dec. 21, 2010, which issued as U.S. Pat. No. 8,284,824 on Oct. 9, 2012, which is a Continuation of application Ser. No. 11/942,473 filed on Nov. 19, 2007, which issued as U.S. Pat. No. 7,856,048 on Dec. 21, 2010, which claims the benefit of U.S. Provisional Application No. 60/866,501 filed on Nov. 20, 2006, including all cited references, which are incorporated herein by reference in their entirety.

BACKGROUND

A transceiver both transmits and receives signals. Both the transmitter and the receiver can have signal processing impairments. Impairments can include path imbalance and oscillator leakage. Both types of impairment can degrade the transmitter's generation of an output signal or the receiver's processing of an input signal.

Path imbalance is an impairment due to unequal performance of an inphase path (I-path) or a quadrature path (Q-path) of a transmitter or receiver. Path imbalances can therefore be called inphase-versus-quadrature (I-Q) imbalance. I-Q imbalance can be caused by either a gain difference or a phase difference between the two paths.

Oscillator leakage is an impairment that can occur when a portion of an oscillator signal feeds through from an input to the output of a mixer. A mixer multiplies two signals, such as an oscillator signal and a signal to be either upconverted or downconverted to a higher or lower frequency, respectively. Neither the oscillator nor the convertible signal should appear in the mixer output, only the product.

Oscillators that are used with mixers are called local oscillators (LO). Since both the transmitter and the receiver use imperfect mixers, a portion of the oscillator signal can appear in a mixer output, i.e. these mixers exhibit I.O leakage.

SUMMARY

An exemplary transceiver autocalibration method can upconvert a bandpass input signal by mixing the bandpass input signal with a local oscillator signal to generate an initial transmitter signal, then loop the initial transmitter signal back to a receiver and downconvert the received initial transmitter signal with another local oscillator signal having a different frequency from the first local oscillator. The downconverted signal can be called an intermediate frequency signal. Adjustments of at least one of the transmitter gain or phase can be based on the intermediate frequency signal and can generate a calibrated transmitter signal that has a minimized transmitter image sideband. The minimized transmitter image sideband can be minimized with respect to either sideband power spectral density or power, i.e., an image sideband power spectral density integrated over an image sideband bandwidth.

In autocalibrating the transmitter, the disclosed method can further include bypassing either the inphase path or the quadrature path of the receiver.

The disclosed method can further include separating or decomposing the intermediate frequency signal into both the transmitter image sideband and a transmitter desired signal.

The disclosed method also includes minimizing the ratio of the power of the transmitter image sideband and the transmitter desired signal.

In an additional aspect of the disclosed method, the intermediate frequency signal can be separated or decomposed into a transmitter LO leakage and a transmitter desired signal. The disclosed method can further include minimizing the ratio of the power of the transmitter LO leakage and the transmitter desired signal by adjusting a DC offset in the transmitter.

According to an exemplary embodiment of the disclosed method, the transceiver's receiver can be autocalibrated by injecting a test signal from either the calibrated transmitter, i.e., a transmitter that generates a calibrated transmitter signal, or a bandpass signal source into a complex receiver. A complex receiver can have both an inphase complex receiver path and a quadrature complex receiver path. The receiver can downconvert the test signal by using the first local oscillator. The first local oscillator signal can be mixed with the test signal to form a complex baseband signal. The method can calibrate the receiver's signal by minimizing the receiver sideband image of the complex baseband signal. Adjusting either the gain or phase of the complex receiver can minimize the receiver sideband image.

In an aspect of the disclosed method, the process of downconverting the test signal can be performed simultaneously on the inphase complex receiver path and the quadrature complex receiver path. In other words, the downconversion can be accomplished in parallel operations rather than in serial operations.

The disclosed method can further provide for digitally filtering the downconverted test signal and the complex baseband signal. The digital filtering methods can be digital finite impulse response (FIR), digital infinite impulse response (IIR), discrete Fourier transform (DFT), or fast Fourier transform (FFT) filtering methods. The filtering methods can generate a receiver sideband image and a receiver desired signal, respectively. The disclosed method can minimize the ratio of the power from the receiver sideband image and the receiver desired signal.

In a further aspect of the disclosed method, the complex baseband signal can be decomposed or separated into a receiver LO leakage and a receiver desired signal. The ratio of the power of the receiver leakage and the receiver desired signal can be minimized by adjusting a DC offset in the receiver.

Other aspects of this disclosure can provide tor an auto-calibratable transceiver. The transceiver can include a transmitter that is configured to upconvert a bandpass input signal by mixing the bandpass input signal with a first local oscillator signal to form an initial transmitter signal. Further, the transceiver can include a receiver that is configured to downconvert the initial transmitter signal with a second local oscillator signal having a frequency that is different from the first local oscillator to form an intermediate frequency signal. A loop back circuit can route the initial transmitter signal from the transmitter to the receiver. At least one of a gain and a phase of the transmitter can be adjusted b an adjusting device based on a transmitter image sideband of the intermediate frequency signal to generate a calibrated transmitter signal having minimized transmitter image sideband. The adjusting device of tile transceiver can minimize the transmitter image sideband power spectral density or transmitter image sideband power.

The transceiver can farther include a switch configured to bypass or disable either the inphase path or a quadrature path of the receiver.

In an aspect of this disclosure, the first local oscillator can be either an on-chip voltage controlled oscillator or a phase locked loop.

This disclosure further provides for digital fibers in the transceiver that can separate the transmitter image sideband and the transmitter desired signal from the intermediate frequency signal. The power ratio of the transmitter image sideband and the transmitter desired signal can be minimized by a minimizer in the transceiver, The transceiver can further include an adjustment circuit that can be configured to adjust a DC offset of the transmitter based on the transmitter LO leakage. The adjustment circuit can generate a calibrated transmitter signal having minimized transmitter LO leakage. The transceiver can further include a transmitter LO leakage digital filter and a reference digital filter that can separate the transmitter LO leakage and the transmitter desired signal from the intermediate frequency signal. A minimizer circuit can minimize the power ratio of the transmitter LO leakage and the transmitter desired signal.

The transceiver can further include 1) a test signal source selector that can select a test signal from either the calibrated transmitter signal or a bandpass signal source, 2) a complex receiver that mixes the test signal with the first local oscillator to downconvert the test signal to a complex baseband signal, and 3) an adjustment circuit or adjusting device that can adjust a gain or a phase of the complex receiver based on a receiver image sideband of the complex baseband signal. The adjustment circuit can generate a calibrated receiver signal having minimized receiver image sideband. The complex receiver can downconvert the test signal on both an inphase and a quadrature complex receiver path simultaneously.

The transceiver can also include digital filters configured to filter the complex baseband signal to generate the receiver image sideband and the receiver desired signal. The first digital filter can process the complex baseband signal to form a receiver image sideband and a reference digital filter can process the complex baseband signal to form the receiver desired signal. The transceiver can also include a minimizer that minimizes a power ratio of the receiver image sideband to the receiver desired signal.

In further aspects or this disclosure, the transceiver can include a digital filter and a reference digital filter that can process the complex baseband signal to generate a receiver LO leakage and a receiver desired signal, respectively, and a minimizer that minimizes a power ratio of the receiver LO leakage to the receiver desired signal.

In further aspects of this disclosure, the transceiver can include an adjuster that can adjust a receiver gain or phase based on a minimization algorithm. The minimization algorithm can minimize the power ratio of the receiver image sideband power to receiver desired signal. The transceiver can also include an adjuster or adjusting circuit that adjusts a DC offset of the receiver based a minimization algorithm that minimizes a power ratio of the receiver LO leakage to receiver desired signal.

BRIEF DESCRIPTION OF THE DRAWINGS

The disclosure will make reference to the accompanying figures, wherein like numerals represent like elements, and wherein:

FIGS. 4A-4E is an exemplary drawing of the frequency domain content of transmitter signals in the system;

DETAILED DESCRIPTION OF EMBODIMENTS

Figure 1:
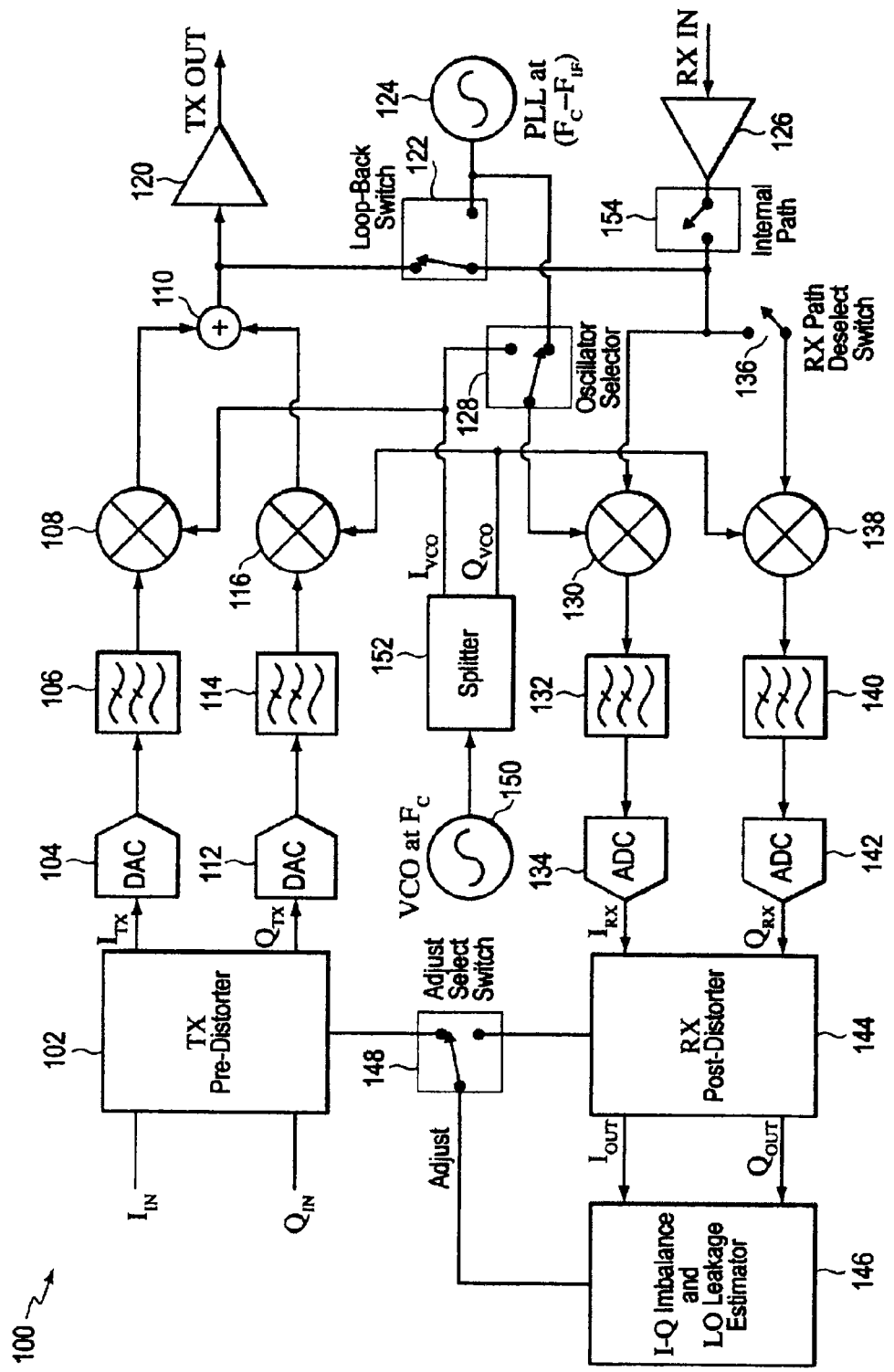
FIG. 1 is an exemplary drawing of a quadrature balanced suppressed carrier autocalibration (QBSCA) system.
Figure 2:
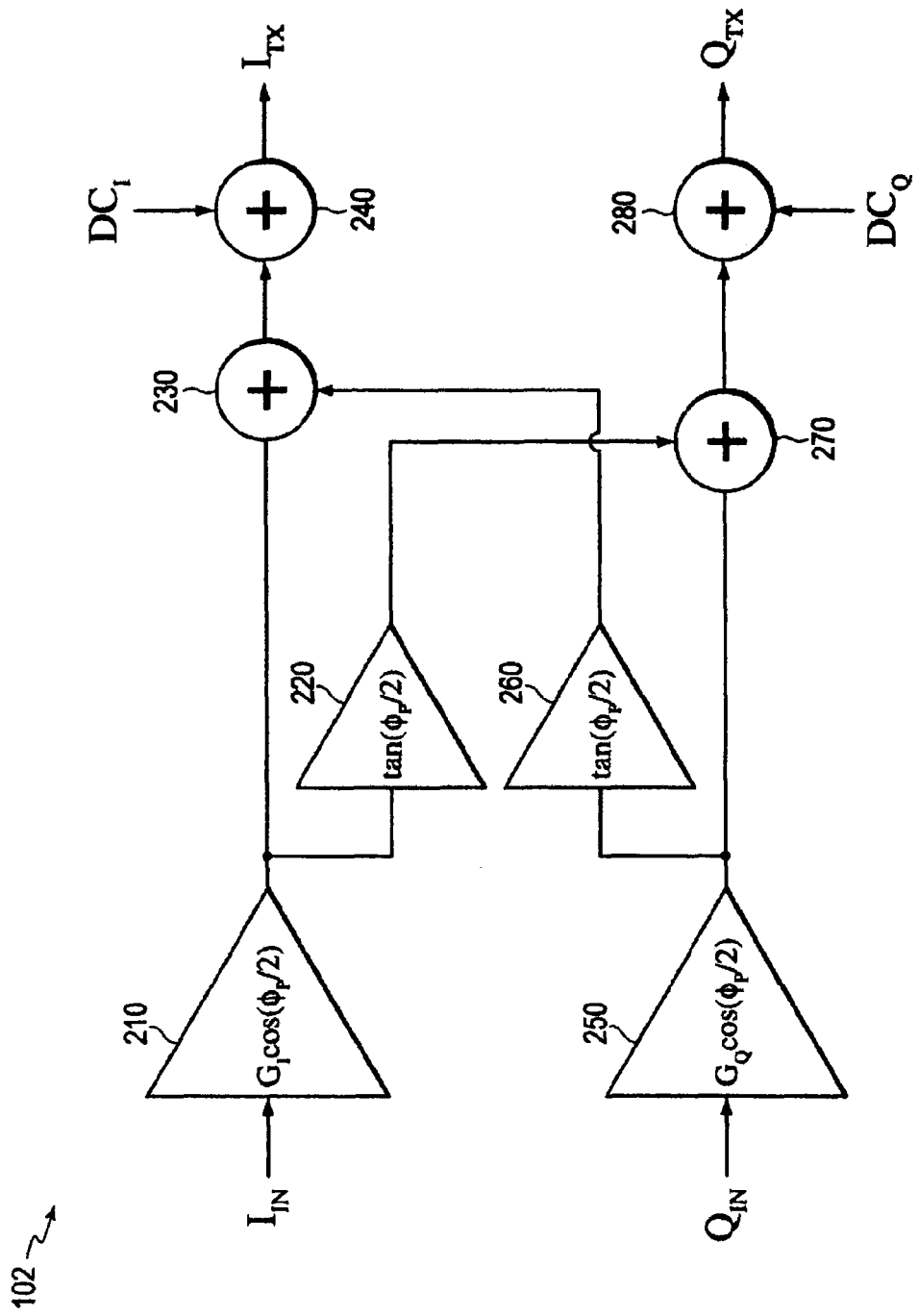
FIG. 2 is an exemplary drawing of a transmitter pre-distorter of the QBSCA system.
Figure 3:
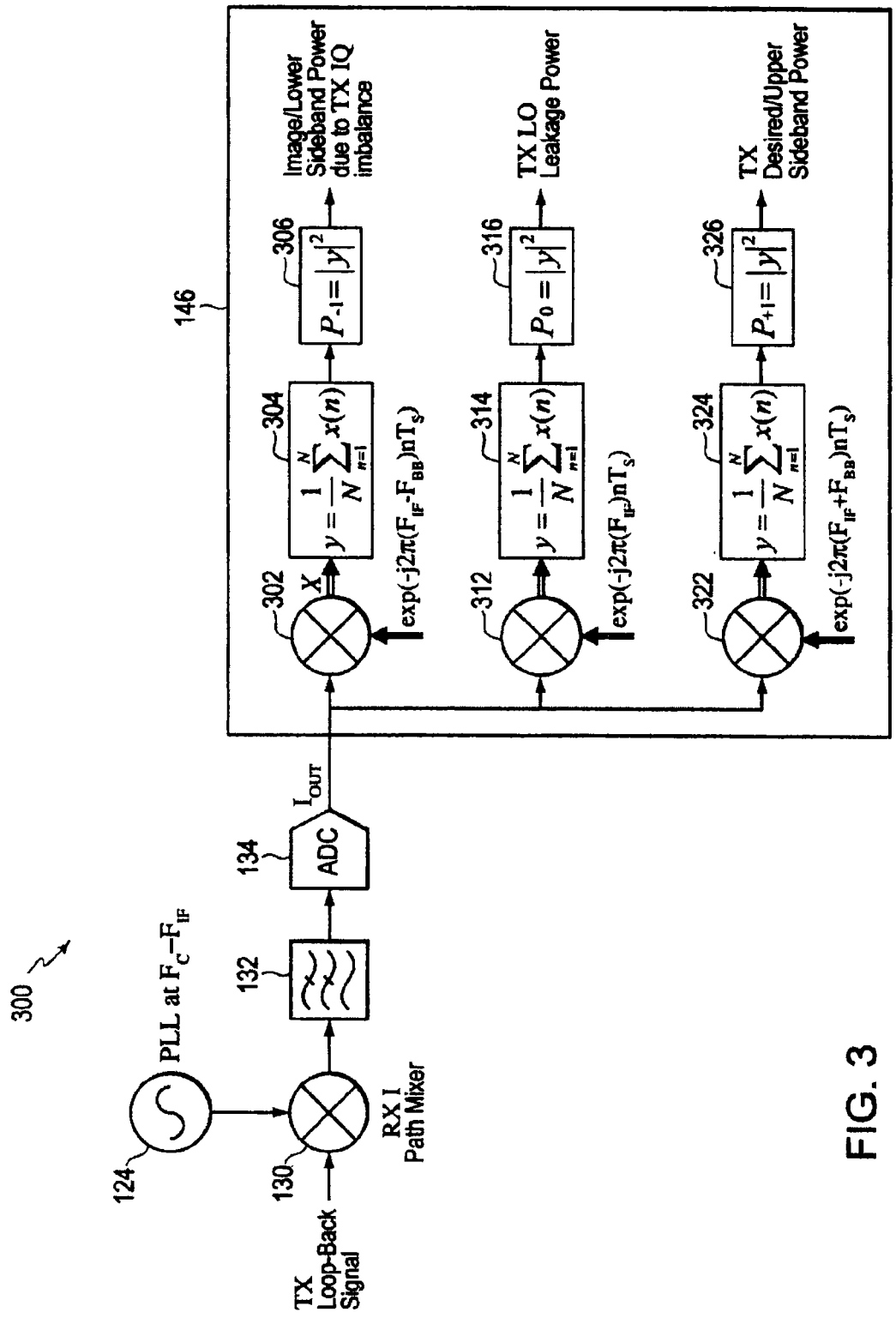
FIG. 3 is an exemplary drawing of an I-Q Imbalance and LO leakage estimator for adjusting the transmitter section of the QBSCA system.
Figure 5:
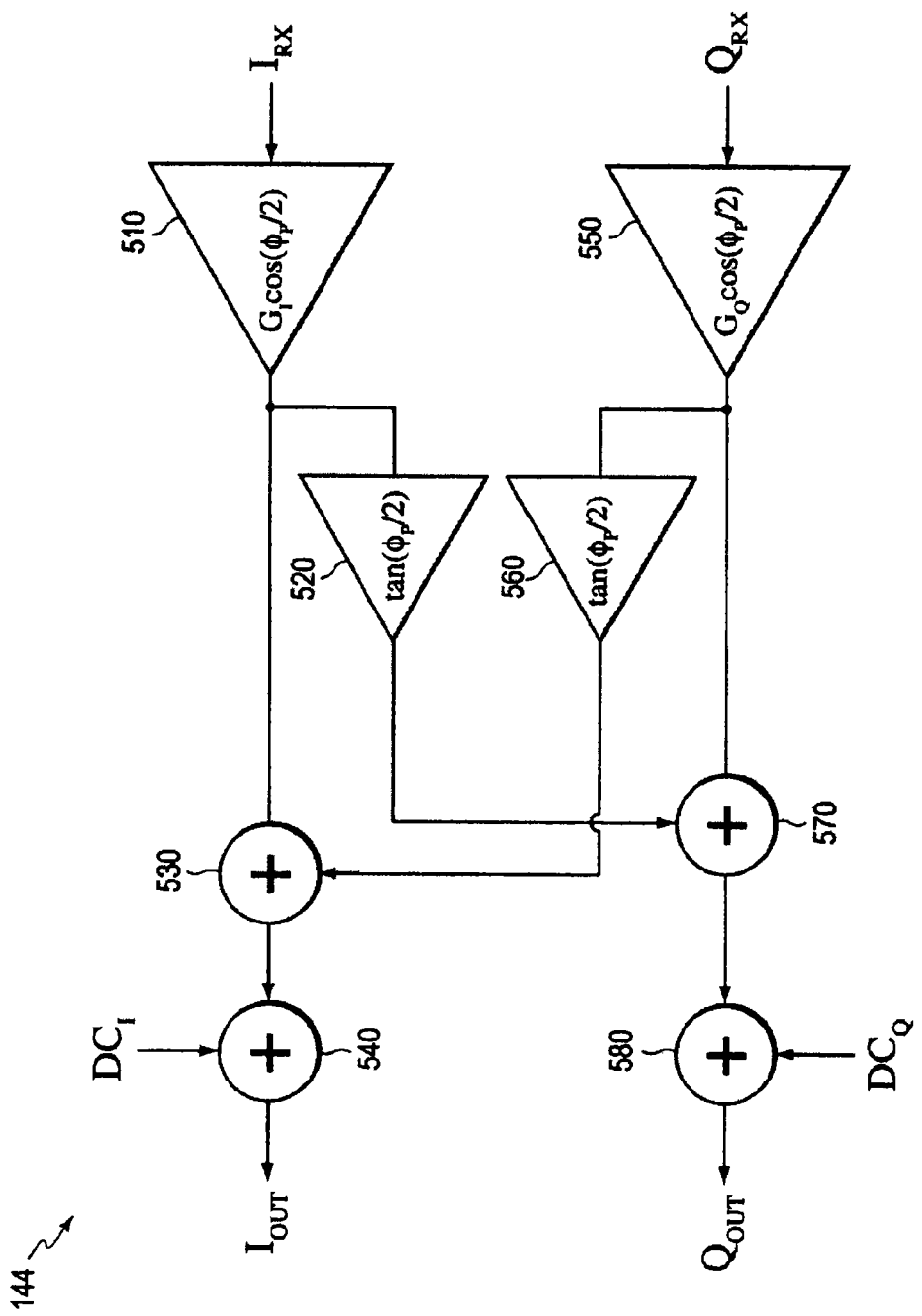
FIG. 5 is an exemplary drawing of a receiver post-distorter of the QBSCA system.
Figure 6:
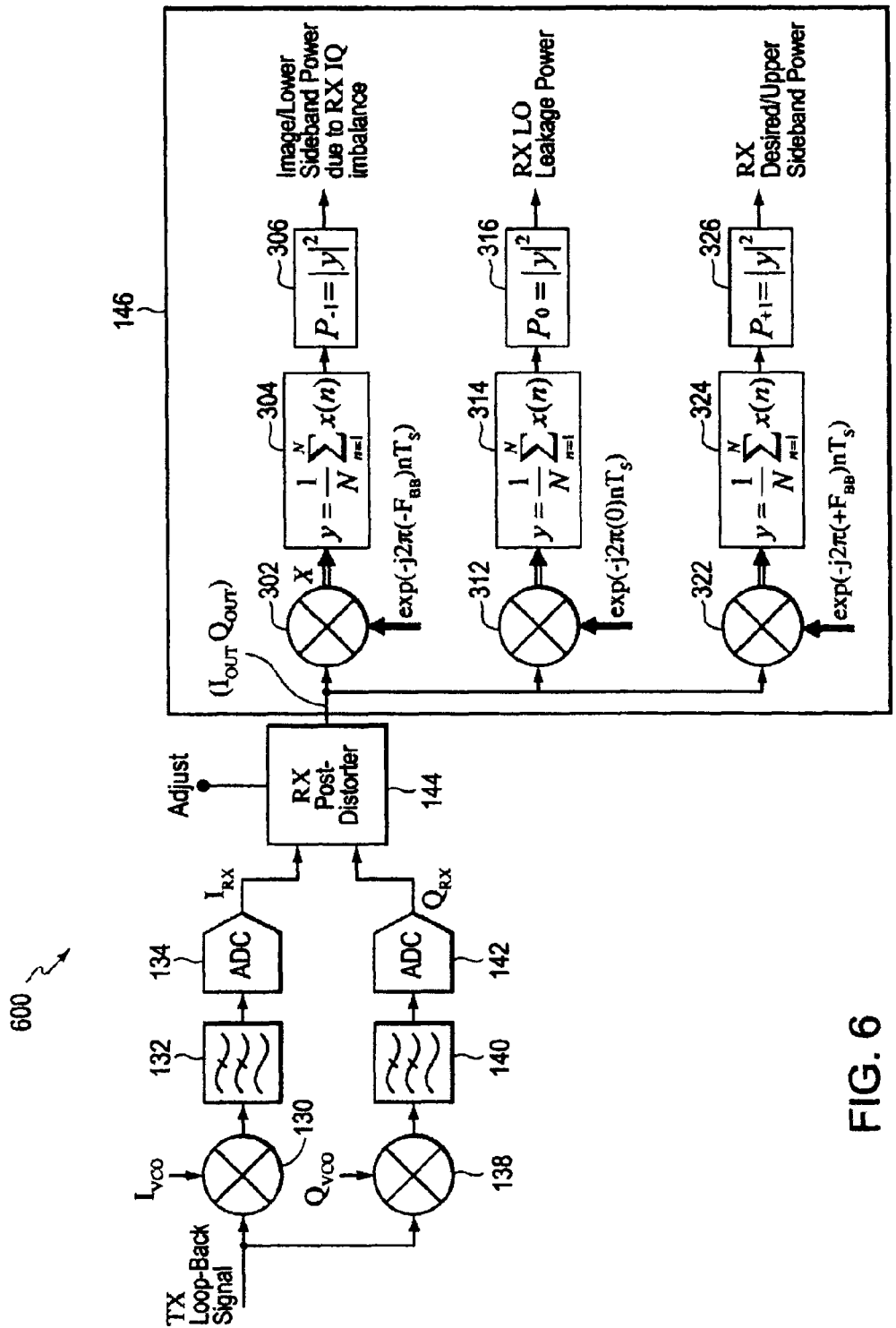
FIG. 6 is an exemplary drawing of an I-Q Imbalance and LO leakage estimator for adjusting the receiver section of the QBSCA system.

FIG. 1 is an exemplary diagram of the quadrature balanced suppressed carrier autocalibration system 100. As shown in FIG. 1, the system 100 can include autocalibration elements, common elements, a transmitter section, and a receiver section. More specifically, system 100 can contain a transmitter (TX) pre-distorter 102, a digital-to-analog convener (DAC) 104, a low pass filter (LPF) 106. a mixer 108, a summer 110, a digital-to-analog converter 112, a low pass filter 114, a mixer 116, a transmitter amplifier 120, a loop-back switch 122, an phase lock loop (PLL) 124, a receiver amplifier 126, an oscillator selector switch 128, a mixer 130, a low pass filter 132, an analog-to-digital converter (ADC) 134, an RX path deselect switch 136, a mixer 138, a low pass filter 140, an analog-to-digital filter 142, a receiver post-distorter 144, an I-Q imbalance and LO leakage estimator 146 (i.e., I-Q estimator 146), an adjust select switch 148, a voltage controlled oscillator (VCO) 150, a splitter 152, and an internal path switch 154. FIG. 1 provides a top-level, perspective of the system 100, FIGS. 2, 3, and 4 provide additional disclosure for the transmitter section, and FIGS. 5, 6, and 7 provide additional disclosure for the receiver section. FIG. 8 provides an exemplary flowchart of the method.

The autocalibration elements can include the loop-back switch 122, oscillator selector switch 128, RX path deselect switch 136, and adjust select switch 148. Additional autocalibration elements, such as the transmitter pre-distorter 102 and the receiver post-distorter 144 will be embedded in the transmitter and receiver sections and described as part of their respective signal flow.

The common elements can include the VCO 150 and the splitter 152. The VCO 150 can provide an oscillator signal or carrier signal to an input of splitter 152. Splitter 152 can provide an output to an autocalibration element, the transmitter section, and the receiver section as described below.

The transmitter section of FIG. 1 can contain the transmitter pre-distorter 102. The inputs and outputs of transmitter pre-distorter 102 can be ($I_{IN}$, $Q_{IN}$) and $I_{TX}$, $Q_{TX}$), respectively. The $I_{IN}$ and $Q_{IN}$ can be from an external signal source (not shown). The $I_{TX}$ and $Q_{TX}$ can be connected to the inputs of DAC 104 and 112, respectively. The DAC 104 and 112 outputs can be connected to inputs of LPF 106 and 114, respectively. The outputs of LPF 106 and 114 can be connected to first inputs of mixer 108 and 116, respectively. The outputs of mixer 108 and 116 can be connected to inputs of summer 110. The polarity of the inputs of summer 110 can be chosen to cancel a lower sideband or an upper sideband of the transmitted signal, thus generating a single sideband (SSB) signal. The output of summer 110 can be connected to an input of transmitter amplifier 120 and to loop-back switch 122.

A second input of mixer 108 can receive an inphase VCO signal, $I_{VCO}$, from the output of splitter 152. A second input of mixer 116 can receive a quadrature VCO signal, $Q_{VCO}$, from splitter 152. The $I_{VCO}$ and $Q_{VCO}$ from splitter 152 can be nearly 90% out of phase.

VCO 150 can provide an oscillator signal to an input of splitter 152. Splitter 152 can provide the $I_{VCO}$ signal to a first terminal of oscillator selector 128 as well as the second input of mixer 108. Splitter 152 can provide a quadrature VCO signal, $Q_{VCO}$, to a second input of mixer 116 and a second input of mixer 138.

The loop back switch 122 can accept an input from summer 110 on first terminal and an input from PLL 124 on a second terminal. A third terminal of loop back switch 122 can connect to a first input of mixer 130 in the receiver section, a first terminal of RX path deselect switch 136, and a first terminal of internal path switch 154. The second terminal of internal path switch 154 can connect to an output of receiver amplifier 126.

The receiver section of FIG. 1 can contain mixer 130, RX path deselect switch 136, and receiver amplifier 126 as described above and additional elements. The additional elements and interconnections can include: a connection from a second terminal RX path deselect switch 136 to a first input of mixer 138, a connection from an output of PLL 124 to a second terminal of oscillator selector switch 128, and a connection from a third terminal of oscillator selector switch 128 to a second input of mixer 130.

The receiver, section's mixer, 130 and 138, outputs can connect to LPF 132 and 140, respectively. The outputs of LPF 132 and 140 can connect to ADC 114 and 142, respectively. The output of ADC 134 and 142 can constitute signals $I_{RX}$ and $Q_{RX}$, respectively. $I_{RX}$ and $Q_{Rx}$ can provide input to RX post-distorter 144. The output of RX post-distorter 144 can be $I_{OUT}$ and $Q_{OUT}$, respectively, which can provide input to I-Q imbalance and LO leakage estimator (I-Q estimator) 146.

I-Q estimator 146 can receive IOUT and $Q_{OUT}$ from RX post-distorter 144 and can output an adjustment signal to a first terminal of adjust select switch 148. A second and third terminal of adjust select switch 148 can provide an output to transmitter pre-distorter 102 and receiver post-distorter 144, respectively.

Transmitter amplifier 120 and receiver amplifier 126 can output a signal TX OUT and receive a signal RX IN, respectively, in normal operation.

System 100 can be operated in an autocalibration mode in addition to a normal transceiver operating mode. A first calibration mode can autocalibrate the transmitter. A second calibration mode can autocalibrate the receiver. The second calibration mode can calibrate the receiver using either the calibrated transmitter or the PLL 124 as a high quality signal.

When system 100 operates in an autocalibration mode, loop-back switch 122 can connect a loop-back signal from an output of summer 110 to one or more of the receiver's mixers. If RX deselect switch 136 is closed, then the loop back signal can be applied to the first inputs of both mixer 130 and mixer 138. If RX deselect switch 136 is open, the loop back signal can be applied to a first input of mixer 130. In this case, the first input of mixer 138 can be left open. During autocalibration mode, internal switch 154 can be open to disconnect the output of receiver amplifier 126 from mixer 130, mixer 138, and loop-back switch 122.

System 100 can operate by autocalibrating the transmitter first then the receiver. This autocalibration sequence can remove or minimize the transmitter's impairments despite receiver impairments. The autocalibrated transmitter or another high quality signal source can then be used to auto-calibrate the receiver, thereby removing or minimizing its impairments.

The transmitter impairment assessment can be immune to receiver impairments if two conditions are met: 1) the receiver processes a real signal using either the I-path or the Q-path, and 2) the real signal is down-converted to a non-zero intermediate frequency (abbreviated as I.F. or IF). In other words, the transmitter impairments can be assessed using an intermediate frequency then removed or minimized. The receiver impairments can be assessed a zero (DC) IF using a high quality signal source, such as the calibrated transmitter, and both RX signal paths, I and Q.

During transmitter autocalibration, i.e., the first mode of system 100, oscillator selector switch 128 can connect PLL 124 to the inphase or quadrature path of the receiver section. Either the inphase or quadrature path can be used to autocalibrate the transmitter section. This disclosure cites the receiver's inphase path for transmitter autocalibration but the quadrature receiver path could equally well be used in an alternate embodiment.

The switch configuration during TX autocalibration can be as follows: 1) loopback switch 122 can be closed between the first and third terminals, thereby connecting the loop-back signal to the receiver section, 2) oscillator selector switch 128 can connect the PLL 124 signal to the second input of mixer 130, 3) RX path deselect switch 136 can be open so the loop-back signal can be processed an the receiver's I-path and not on the Q-path, 4) adjust select switch 148 can connect the output or I-Q estimator 146 to an adjustment receiving input of TX pre-distorter 102, and RX post-distorter 144 can be internally bypassed. In other words, RX post-distorter 144 can pass $I_{RX}$ to $I_{OUT}$ and $Q_{RX}$ to $Q_{OUT}$ without modification during transmitter autocalibration.

The TX can receive and process an input signal ($I_{IN}$, $Q_{IN}$) during TX autocalibration. The input signal can be a signal within the TX's. baseband. The TX LPFs 104 and 114 spectral properties can establish the transmitter's baseband. The spectral properties of the RX LPFs 132 and 140 can establish the receiver's baseband. These basebands can be similar but may or may not be identical. In an exemplary case, receiver baseband can be broader than the transmitter baseband by a factor of two or vice versa. In an exemplary case, the input signal input ($I_{IN}$, $Q_{IN}$) can be within the baseband of both the transmitter and receiver. In an exemplary case, the input signal can be a single sinusoid, a pure tone, a bandpass signal, a single sideband signal, and the like.

An SSB signal has either an upper sidelobe or a lower sidelobe, but not both. The upper or lower sidelobe's frequency spectrum is either above or below a reference frequency, respectively. The reference frequency can he an oscillator frequency or an intermediate frequency (I.F.), including DC IF. By convention, frequencies are positive for real (i.e., not complex) signals. Negative frequencies can occur for complex (i.e., inphase and quadrature) signals.

A well balanced transmitter without significant LO leakage can transmit a tone or an SSB signal with nearly all its power in either an upper sideband or a lower sideband, but not both. In particular, if the transmitter is unimpaired and VCO 150 oscillates at a frequency $F_C$ and the input signal is a tone at a frequency $F_{BB}$, then the unconverted test signal can contain power only at $F_C+F_{BB}$, not at $F_C$ or $F_C-F_{BB}$ or at any other frequency. If the upconverted input signal has power at either $F_C-F_{BB}$, then the TX suffers from I-Q imbalance, i.e., either a gain imbalance or a phase imbalance or both. The spectrum around $F_C-F_{BB}$ can be called the image of the upconverted input signal and $FC-F_{BB}$ can be called the image frequency.

To balance and minimize LO leakage in the transmitter, the PLL 124 signal from oscillator selector 128 can drive a second input of the receiver's mixer 130 to downconvert the loop-back signal to an intermediate frequency. The intermediate frequency can be offset from the carrier frequency, $F_C$ by an amount $F_{IF}$, thus producing an offset oscillator signal at $F_C-F_{IF}$. In an alternative embodiment, the PLL 124 frequency can be $F_C+F_{IF}$ instead of $F_C-F_{IF}$. If $F_C+F_{IF}$ is used, the roles of the upper and lower sidebands are swapped. It should be understood that swapping the roles of the upper and lower sidebands does not hinder system 100; the desired frequency (normally the upper sideband) and image frequency (normally the lower sideband) are simply redefined.

Downconversion can create an undesired double frequency signal at approximately twice the carrier frequency, $F_C$. LPF 132 can remove the double frequency signal from mixer 130's output signal. LPF 132 can remove or cut off signals with frequency content outside of baseband. In an exemplary case, the LPF 132 cutoff frequency, i.e. the baseband bandwidth, can be 5 MHz to 10 MHz.

During TX autocalibration, the RX post-distorter 144 can he internally bypassed and the I-Q estimator 146 output signal can send an adjust signal to TX pre-distorter 102 through adjust select switch 148. The adjust signal can modify a 1) phase difference, or 2) a phase difference, an inphase gain, and quadrature gain, and/or 3) one or more offset signals of TX pre-distorter 102. During TX autocalibration, the I-Q estimator 146 can process $I_{OUT}$ as a real signal at a non-zero intermediate frequency, $F_{IF}$. In an exemplary case, the adjust signal can be obtained from a blind search, minimization, or adaptive filter algorithm including: a least-mean-square (LMS) algorithm, blind algorithm, a simplex method, a conjugate gradient method such as Fletcher-Reeve's version of the conjugate gradient method or Polak-Ribiere's version of the conjugate gradient method, a direction set method, Powell's quadratically convergent method, a downhill simplex method, a variable metric method such as Davidson-Fletcher-Powell, a variable metric method such as Broyden-Fleteher-Goldfarb-Shannon, a linear programming method, and the like.

In a first exemplary case, a blind algorithm can find the inphase and quadrature path gains separately than find the inphase versus quadrature phase imbalance. There can be more than one was to find inphase and quadrature gains separately. For example, the blind algorithm can: 1) disable the TX Q-path, 2) adjust $DC_I$ (or equivalently, adjust a DC value of $I_{IN}$) to minimize the received LO leakage power at $F_{IF}$, 3) generate an input test tone at a frequency $F_{BB}$ and measure the received power at the $F_{IF}+F_{BB}$, then 4) disable the. TX I-path, 5) adjust $DC_Q$ (or equivalently, adjust a DC value of $Q_{IN}$) to minimize the received LO leakage power at $F_{IF}$, 6) generate an input test tone at a frequency $F_{BB}$ and measure the received power at the $F_{IF}+F_{BB}$, 7) scale the quadrature gain by the inphase gain times the square root ot the ratio of Q-path-only to I-path-only -received power, then 7) re-enable the I-path find the TX phase imbalance by minimizing the ratio of the image sideband to desired signal sideband power.

In a second exemplary case, the TX inphase and quadrature path gains can be found separately by: 1) finding a TX inphase path gain and DC offset, $G_I$ and $DC_I$, by stepping $DC_I$ and measuring the received signal power at $F_{IF}$, then 2) finding a TX quadrature path gain and DC offset, $G_Q$ and $DC_Q$, by stepping $DC_Q$ and measuring the received signal power at $F_{IF}$, and then 3) finding the TX inphase versus quadrature path phase imbalance by comparing an image sideband to a desired signal sideband as described below. In this exemplary case, $DC_I$ ($DC_Q$) can minimize the TX (RX) leakage power at $F_{IF}$ and $G_I$ ($G_Q$) can be determined from a parabolic fit of $F_{IF}$ power (y) versus $DC_I$ ($DC_Q$). This second exemplary ease does not require an input test tone and can enable analysis at a single frequency. $F_{IF}$, rather then $F_{IF}$ and $F_{BB}$, but does not exercise the transmitter at a non-zero frequency within its baseband.

FIG. 2 shows a transmitter pre-distorter 102 that can contain a first inphase amplifier 210, a first crossover amplifier 220, a first summer 230, a second summer 240, a second input amplifier 250, a second crossover amplifier 200, a third summer 270, and a fourth summer 280. First input amplifier 210 can accept a signal and can output a signal to both first crossover amplifier 220 and an input of first summer 230. Second summer 240 can accept an offset constant, $DC_I$, input and an output of first summer 230, and can output $I_{TX}$, which can be a first output of the transmitter pre-distorter 102. Second input amplifier 250 can accept a signal $Q_{IN}$ and can output a signal to second crossover amplifier 260 and an input of third summer 270. Third summer 270 can accept an input from first crossover amplifier 220 and a summed signal to fourth summer 280. Fourth summer 280 can accept an input from an offset constant, $DC_Q$, as well as an output of third summer 270 and can output $Q_{TX}$, which can be a second output of the transmitter pre-distorter 102.

In operation, TX pre-distorter 102 can amplify signals in two paths, and can add a portion of each path to the opposite path, then can offset the signal from each path independently. The first path can amplify the $I_{IN}$ signal by a factor $G_I \cdot \cos(\Phi_P/2)$ to produce $I_{IN} \cdot G_I \cdot \cos(\Phi_P/2)$ and can add $Q_{IN} \cdot G_Q \cdot \sin(\Phi_P/2)$ plus $DC_I$. The second path can amplify the $Q_{IN}$ signal by a factor $G_Q \cdot \cos(\Phi_P/2)$ to produce $Q_{IN} \cdot G_Q \cdot \cos(\Phi_P/2)$ and can add $I_{IN} \cdot G_I \cdot \sin(\Phi_P/2)$ plus $DC_Q$. The TX pre-distorter 102 inphase output, $I_{TX}$, can equal $I_{IN} \cdot G_I \cdot \cos(\Phi_P/2)$ plus $Q_{IN} \cdot G_Q \cdot \sin(\Phi_P/2)$ plus $DC_I$. The TX pre-distorter 102 quadrature output, $Q_{TX}$, can equal $I_{IN} \cdot G_I \cdot \sin(\Phi_P/2)$ plus $Q_{IN} \cdot G_Q \cdot \cos(\Phi_P/2)$ plus $DC_Q$. The values of $G_I$, $G_Q$, $\Phi_P$, $DC_I$, and $DC_Q$ variables shown in FIG. 2 can be unique to the TX pre-distorter 102.

The TX pre-distorter 102 can eliminate or minimize the inphase versus quadrature (i.e. I-Q) imbalance in a transmitter when $G_I$, $G_Q$, and $\Phi_P$ are properly adjusted. The TX pre-distorter 102 can eliminate or minimize the LO leakage in a transmitter when $DC_I$ and $DC_Q$ are properly adjusted. FIG. 3 and FIG. 4 show an exemplary I-Q balance and leakage estimator 102 and frequency domain content for adjusting $G_I$, $G_Q$, $\Phi_P$, $DC_I$, and $DC_Q$.

FIG. 3 shows an I-Q imbalance and LO leakage estimator 300 for transmitter autocalibration in which mixer 130 can accept a transmitter loop-back signal on one input and an PLL 124 signal on a second input. The mixer 130 can output a signal to low pass filter 132, which can provide an input to ADC 134. ADC 134 can output a signal $I_{Rx}$ that can be internally passed through the receiver post-distorter 144 (not shown), configured to pass the inphase signal directly front input to output, $I_{OUT}$. The $I_{OUT}$ signal can be connected to a plurality of mixers, such as mixers 302, 312, and 322. Elements 302, 304, 312, 314, 322, and 324 can implement a 3-point discrete Fourier transform (DFT). The DFT or a fast Fourier transform (FFT) can implement one or more digital filters to separate individual signal components. Equivalent digital filters can be implemented with finite impulse response (FIR) filters, infinite impulse response (IIR) filters, polyphase filters, and the like.

The I-Q estimator 146 can use three mixers to assess the signal power that is below, at, and above an intermediate frequency (I.F.). The signal can be decomposed in the frequency domain into a lower sideband or image signal, an LO or LO leakage signal, and an upper sideband or desired signal, respectively. In an exemplary case, the I.F. used by I-Q estimator 146 can be non-zero for transmitter autocalibration and zero for receiver autocalibration.

During TX autocalibration, each mixer of I-Q balance and LO leakage estimator 146 can accept a real signal on a first input and a complex signal on a second input. Each mixer can output a complex signal that is the product of the real $I_{RX}$ signal and the complex input. During TX autocalibration, the real $I_{RX}$ input to mixers 302, 312, and 322 can be at a non-zero intermediate frequency (I.F.).

Mixer 302's output signal can be accumulated in accumulator 304 and the output of accumulator 304 can be squared in squarer 306. Likewise, the output of mixer 312 can be output to accumulator 314 and squared by squarer 316. Mixer 322's output can be accumulated in accumulator 324 and squared in squarer 326.

The complex inputs to mixers 302, 312 and 322 can be complex exponentials (i.e., inphase and quadrature sinusoids). Each exponential can have as its frequency $F_{IF}-F_{BB}$, $F_{IF}$, and $F_{IF}+F_{BB}$, respectively. Each complex exponential's frequency can multiplied by $-j$, where j is a unit-magnitude imaginary number, times $2\pi nT_S$, where n is a sample count, and $T_S$ is a sampling period. Each ADC in FIG. 1 can use the same sampling period. In an exemplary case, the sample count can range from 1 to an upper value N.

The upper value of sample count N can be large enough so the accumulator can integrate its input, X, for a time, $N \cdot T_S$, that is long enough to significantly reduce double frequency signals and noise above the baseband. In an exemplary case, $N \cdot T_S$ can be long enough so that each mixer and its paired accumulator can act as a digital filter of specified bandwidth centered on the frequency of the mixer's complex exponential.

A complex exponential applied to a mixer in the I-Q balance and leakage estimator 146 can be a clockwise rotating phasor that can downconvert the real $I_{OUT}$ signal's content from a mixer input frequency, i.e., $F_{IF}-F_{BB}$, $F_{IF}$, and $F_{IF}+F_{BB}$, to DC, i.e., zero I.F. frequency. In an embodiment, the each mixer and its paired accumulator can be replaced by a narrow band pass filter at $F_{IF}-F_{BB}$, $F_{IF}$, and $F_{IF}+F_{BB}$ and each filter's bandwidth can be much narrower than the baseband.

The output of squarer 306 can be the image/lower sideband power due to transmitter I-Q imbalance. The output of squarer 316 can be the transmitter LO leakage power. The output of squarer 326 can be the transmitter upper sideband power.

FIG. 4A shows a baseband test signal containing power at a single frequency $F_{BB}$, FIG. 4B shows an impairment free transmitted signal with power primarily at $F_C+F_{BB}$, FIG. 4C shows an impaired transmitted signal with power at three frequencies, $F_C-F_{BB}$, $F_C$, and $F_C+F_{BB}$, FIG. 4D shows an impaired downconverted signal, and FIG. 4E shows an impairment-free downconverted signal. The impaired downconverted signal can exhibit transmitter I-Q imbalance image power at a frequency $F_{IF}-F_{BB}$, transmitter LO leakage power at frequency $F_{IF}$, and an upper sideband or desired signal at $F_{IF}+F_{BB}$ and negligible power at either $F_{IF}-F_{BB}$ or $F_{IF}$. If the PLL 124 operates at $F_C-F_{IF}$ and has little phase noise, then the impaired downconverted signal can be a close replica of impaired transmitted signal, only translated to a lower frequency by $F_C-F_{IF}$.

FIGS. 1, 2, 3, and 4 pertain to the disclosure of devices and methods for transmitter autocalibration. Next. FIG. 1 along with FIGS. 5, 6, and 7 pertain to the disclosure of devices and methods for receiver autocalibration.

During receiver autocalibration, the autocalibration switch configuration can be: 1) loopback switch 122 can connect the loop-back signal from summer 110 to both a first input mixer 130 and a first terminal of RX deselect switch 136, 2) oscillator selector switch 128 can connect the splitter 152's $I_{VCO}$ signal to a second input of mixer 130, 3) RX path deselect switch 136 can be closed so the second terminal of RX deselect switch can provide the loopback switch 122's third terminal signal to the first input of mixer 138 (i.e., both the inphase and quadrature receiver paths can process the same signal), and 4) adjust select switch 148 can connect the output of I-Q estimator 146 to an input of RX post-distorter 144.

An alternate embodiment of RX autocalibration can use the PLL 124 signal instead of an autocalibrated transmitter signal as a test signal source. In the alternate embodiment, the second and third terminals of loop back switch 122 can connect PLL 124's signal to the first input of mixer 130 and, through RX deselect switch 136, arid the first input of mixer 138 rather than the loop back signal from summer 110. Other autocalibration configuration settings can remain the same.

FIG. 5 shows a receiver post-distorter for receiver autocalibration. The receiver post-distorter 144 can have a similar structure to the transmitter pre-distorter 102 shown in FIG. 2. In other words, the connections and functions of each element in receiver post-distorter can be identical to those of transmitter pre-distorter. Signal flow in FIG. 5 is shown from right to left to match the post-distorter 144's signal flow direction as shown in FIG. 1. The values of $G_I$, $G_Q$, $\Phi_P$, $DC_I$, and $DC_Q$ variables shown in FIG. 5 can be unique to the RX post-distorter 144. In other words, the values of the variables used for the TX pre-distorter 102 and the RX post-distorter 144 can be different. In an exemplary case, the adjust signal can be obtained from a search or minimization or adaptive filter algorithm including, a least-mean-square (LMS) algorithm, a blind algorithm, a simplex method, a conjugate gradient method, and the like.

FIG. 6 shows the I-Q estimator 146 configured for receiver autocalibration. In FIG. 6, mixer 130 and mixer 138 can both receive a signal from loop-back switch 122 that can he either a transmitter loop-back signal or a PLL 124 signal. When the PLL signal is selected to calibrate the receiver, the PLL frequency, $F_{PLL}$, can be approximately $F_C-F_B$, $F_C-F_{IF}$, or any frequency near the carrier frequency. The following discussion pertains to an autocalibrated transmitter loop-back signal or PLL signal at approximately $F_C+F_{BB}$. The discussion can be generalized by substituting $-(F_{PLL}-F_C)$, 0, and $+(F_{PLL}-F_C)$, for $-F_{BB}$, 0, $F_{BB}$, respectively. In particular, if the PLL frequency is unchanged from transmitter autocalibration, i.e. $F_C-F_{IF}$, then $+F_{IF}$, 0, and $-F_{IF}$ are used instead of $-F_{BB}$, 0, $F_{BB}$, respectively. In this case, the I.F. frequency can be within the receiver baseband and the roles of upper (desired) and lower (image) sideband can be swapped.

Mixer 130, low pass filter 132 and ADC 134 can constitute an inphase input to receiver post-distorter 144 while mixer 138, low pass filter 140, and ADC 142 can constitute a quadrature input. The output of receiver post-distorter 144 can be a complex signal, which can be provided to mixer 302, 312 and 322 as described for FIG. 3 but with different frequencies of the complex exponentials.

The complex exponential input to each of mixers 302, 312, and 322 of I-Q estimator 146 mixers can be sinusoidal at frequency of $-F_{BB}$, 0, and $+F_{BB}$, respectively, when either the autocalibrated transmitter loop-back signal or PLL signal frequency is approximately $F_C+F_B$. The I-Q estimator 146 mixer frequencies can be negative, not just zero or positive, because the receiver input signal can be complex during both receiver autocalibration and normal operation.

Figure 7A:
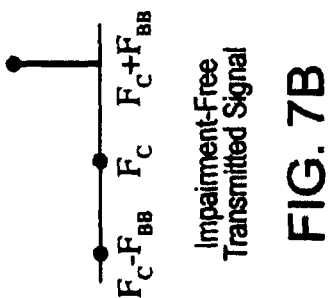
FIGS. 7A-7D is an exemplary drawing of the frequency domain content of baseband and receiver signals in the QBSCA system.
Figure 7B:
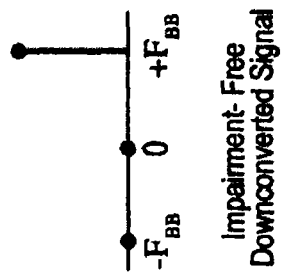
Figure 7C:
Figure 7D:
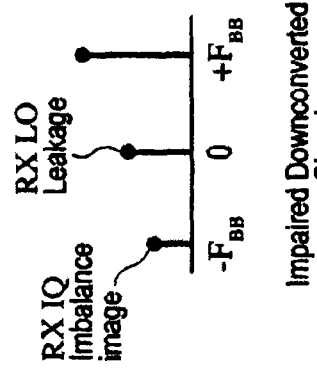
Figure 8:
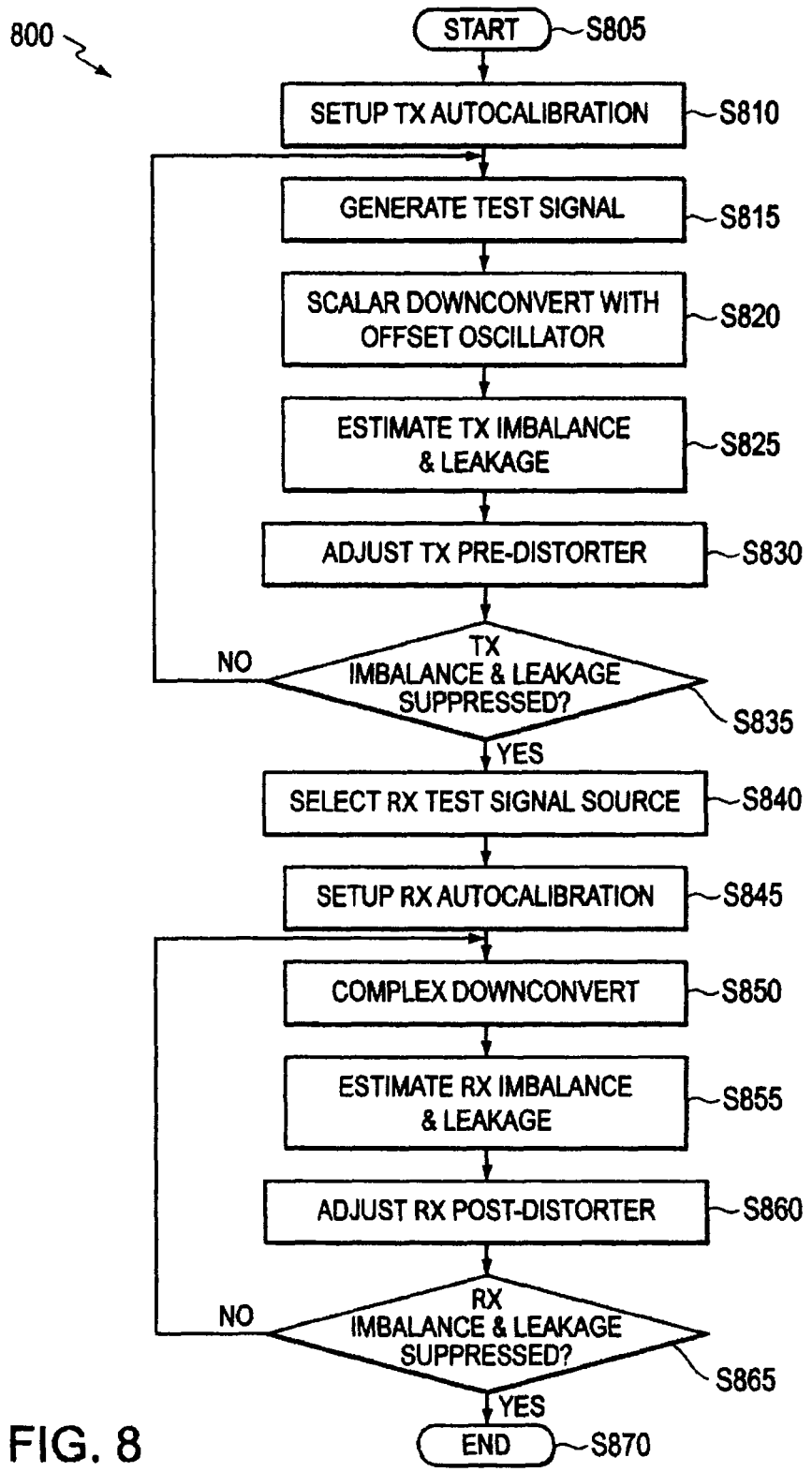
FIG. 8 is an exemplary flowchart of the QBSCA system.

FIG. 7A shows a baseband test signal with nearly all its power at a frequency $F_{BB}$, Fib. FIG. 7B shows an impairment-free transmitted signal with nearly all its power at $F_C+F_{BB}$, FIG. 7C an impaired downconverted signal, and FIG. 7D shows an impairment-free downconverted signal. The impairment-free transmitted signal can be from an autocalibrated transmitter or from PLL 124 operating at a frequency $F_{PLL}=F_C+F_{BB}$.

The impaired downconverted signal can exhibit I-Q imbalance in the image at a frequency $-F_{BB}$, receiver LO leakage at DC (i.e., zero I.F.), and an upper side band or desired signal at positive frequency $F_{BB}$. When receiver autocalibration is complete, the impairment-free downconverted signal 740 can exhibit nearly all of its power at a positive frequency $F_{BB}$.

FIG. 8 shows a flowchart of the system 100. The flowchart and program flow start with step S805 and can proceed to step S810 where the autocalibration elements can be configured to loopback the transmitter signal to the receiver, route an offset oscillator signal to a receiver mixer, deselect a path of the receiver, and route an adjust signal to a predistorter. In an exemplary case: 1) loopback switch 122 can be closed between the first and third terminals, thereby connecting the loop-back signal to the receiver section, 2) oscillator selector switch 128 can connect the PLL 124 signal to the second input of mixer 130, 3) RX path deselect switch 136 can be open so the loop-back signal can be processed on the receiver's I-path, 4) adjust select switch 148 can connect the output of I-Q estimator 146 to an adjustment receiving input of TX pre-distorter 102, and RX post-distorter 144 can be internally bypassed.

Alter step S810, program flow can proceed to step S815 where a test signal can be generated and upconverted to generate an upconverted test signal near a carrier frequency. In an exemplary case, the test signal can be a sinusoid at a frequency $F_{BB}$ and the unconverted test signal can be at a frequency $F_C+F_{BB}$. In an exemplary case, the test signal and the upconverted test signal can each approximate a bandpass signal.

After step S815, program flow can proceed to step S820 where the upconverted test signal can be downconverted by an offset oscillator signal. The offset oscillator frequency can be offset from the carrier frequency by an intermediate frequency. In an exemplary case, the offset oscillator frequency is either less than or greater than the carrier frequency.

After step S820, program flow can proceed to step S825 where the transmitter imbalance and LO leakage measurements can be taken and processed to produce imbalance and leakage estimates. In an exemplary case, a blind algorithm can find the inphase and quadrature path gains separately then find the inphase versus quadrature phase imbalance. For example, the blind algorithm can: 1) disable the TX Q-path, 2) adjust $DC_I$ to minimize the received LO leakage power at $F_{IF}$, 3) generate a test tone at a frequency $F_{BB}$ and measure the received power at the $F_{IF}+F_{BB}$, then 4) disable the TX I-path, 5) adjust $DC_Q$ minimize the received LO leakage power at $F_{IF}$, 6) generate a test tone at a frequency $F_{BB}$ and measure the received power at the $F_{IF}+F_{BB}$, 7) scale the quadrature gain by the inphase gain times the square root of the ratio of Q-path-only to I-path-only -received power, and 8) re-enable the I-path find the TX phase imbalance by minimizing the ratio of the image sideband to desired signal sideband power.

After step S825, program flow can proceed to step S830 where an adjust signal can change the I-Q imbalance and LO leakage in the upconverted test signal. In an exemplary case, the adjust signal reduces both I-Q imbalance and LO leakage by adjusting the TX $G_I$, $G_Q$, $\Phi_P$, $DC_I$, and $DC_Q$ variables. In an exemplary case, the adjust signal can be obtained from a search or minimization or adaptive filter algorithm including, a least-mean-square (LMS) algorithm, a blind algorithm, a simplex method, a conjugate gradient method, and the like.

After step S830, program flow can proceed to step S835 where the TX imbalance and leakage estimates can be compared with impairment performance criteria. In an exemplary case, these criteria are the ratios of image to desired signal power and the LO leakage power to desired signal power and are in the range of −20 dB to −120 dB. If the comparison indicates the criteria are met, i.e., the TX is essentially unimpaired, then program flow can proceed to step S840, otherwise program flow can return to step S820.

After step S835, program flow can proceed to step S840 where the RX test signal source can be selected. In an exemplary case, the test signal source can be the autocalibrated TX or the PLL, i.e., an offset oscillator.

After step S840, program flow can proceed to step S845 where the RX autocalibration can be setup. In an exemplary case, RX autocalibration setup can include: 1) loopback switch 122 can connect the loop-back signal from summer 110 to both a first input mixer 130 and a first terminal of RX deselect switch 136, 2) oscillator selector switch 128 can connect the splitter 152's $I_{VCO}$ signal to a second input of mixer 130, 3) RX path deselect switch 136 can be closed so the second terminal of RX deselect switch can provide the loop switch 122's third terminal signal to the first input of mixer 138 (i.e. both the inphase and quadrature receiver paths can process the same signal), and 4) adjust select switch 148 can connect the output of I-Q estimator 146 to an input of RX pre-distorter 144. In an alternate exemplary case, RX auto-calibration setup can include setting the second and third terminals of loop back switch 122 to connect PLL 124's signal to the first input of mixer 130 and, through RX deselect switch 136, to the first input of mixer 138 rather than the loop back signal from summer 110. The other autocalibration configuration settings in this alternate exemplary case can remain the same as the previous exemplary case.

After step S845, program flow can proceed to step S850 where the RX test signal can be downconverted to a complex baseband signal. In an exemplary case, the VCO 150 signal can downconvert the RX test signal to a DC I.F. using both the I-path and the Q-path of the receiver.

After step S850, program flow can proceed to step S855 where the receiver imbalance and LO leakage measurements can be taken and processed to produce imbalance and leakage estimates. As with step S820, the RX I-path $G_I$ and $DC_I$ can be estimated separate from the RX Q-path's $G_Q$ and $DC_Q$ variables. Using these variables then the RX $\Phi_P$ phase imbalance can be estimated.

After step S855, program flow can proceed to step S860 where an adjust signal can change the I-Q imbalance and LO leakage in the complex baseband signal. In an exemplary case, the adjust signal can reduce both I-Q imbalance and LO leakage by adjusting the RX $G_I$, $G_Q$, $\Phi_P$, $DC_I$, and/or $DC_Q$ variables. In an exemplary case, the adjust signal can be obtained from a search or minimization or adaptive filter algorithm including, a least-mean-square (LMS) algorithm, a blind algorithm, a simplex method, a conjugate gradient method, and the like.

After step S860, program flow can proceed to step S865 where the RX imbalance and leakage estimates can be compared with impairment performance criteria. In an exemplary case, the ratios of image versus desired signal power and the LO leakage power versus desired signal power are both in the range of −20 dB to −120 dB. If the comparison indicates the RX is unimpaired or nearly unimpaired according to the performance criteria, then program flow can proceed to step S870, where it can stop, otherwise program flow can return to step S850.

The following theory of operation discussion recapitulates and elucidates the previous discussion of the system 100.

When an SSB signal, or a sinusoid, or a tone is degraded by an imperfect TX or RX, an image component can appear in the lower sideband. By definition, the image of a frequency $F_c+F_{BB}$ is at $F_C-F_{BB}$ or the converse. The image rejection ratio (IRR) is defined as the ratio of the power at a desired sideband frequency, $P_{+1}$, to the image sideband power, $P_{-1}$. Usually the IRR is expressed in dB, i.e., IRR=10*log($P_{+1}$/$P_{-1}$). The IRR can contain information about the transmitter's and/or receiver's gain imbalance and phase imbalance and can be used to adjust TX pre-distorter or RX post-distorter variables.

An imperfect TX can be degraded by LO leakage as well as by I-Q imbalance. LO leakage is an undesired oscillator signal that can appear at the output of a mixer. The LO can be a mixer's local oscillator and, in an exemplary case, can be located on-chip through monolithic or hybrid integration. In this disclosure, either the VCO or the PLL can be a local oscillator.

During autocalibration, the transmitter's impairments can he masked by the receiver's impairments. The transmitter signal can be looped-back to the receiver during autocalibration to provide an end-to-end connection. The loop-back path can be internal to the transceiver chip. Both sets of impairments can be evident in the received signal because the TX and RX impairments can occur in series.

If the transmitter's upconverted signal is primarily at $F_C+F_{BB}$, TX I-Q imbalance can generate an additional, image signal $F_C-F_{BB}$. The VCO signal can leak through one or more TX mixer to contribute LO leakage in the transmitter's upconverted signal.

To isolate and eliminate TX impairments due to the TX I-Q imbalance: 1) the TX signal can be looped-back to the RX, 2) the TX autocalibration can be performed at a non-zero intermediate frequency (IF), $F_{IF}$, and 3) the RX signal can be processed on a single path, either the I-path or the Q-path but not both.

An I-Q phase locked loop (PLL) can generate a frequency $F_C-F_{IF}$ that is offset from the carrier $F_C$ by $F_{IF}$. In an exemplary case, the intermediate frequency, $F_{IF}$, can be within the lesser of the transmitter and receiver baseband but above $F_{BB}$ and much less than $F_C$. The PLL can be on-chip and can be used just for autocalibration and then turned off.

When the PLL signal is injected into a mixer, the mixer can downconvert a signal by $F_C-F_{IF}$. When an SSB signal at frequency $F_C+F_{BB}$ is downconverted by an PLL and a perfect mixer, its power is translated to two frequencies: $F_{IF}+F_{BB}$ and $2 \cdot F_{C-FIF}+F_{BB}$. The second of these two frequencies is called a double frequency term. Double frequency terms are high frequencies; these terms can be eliminated by a lowpass filter (LPF).

Each I or Q channel of the receiver has an LPF. The LPF can clean up the mixer output, primarily by rejecting double frequency terms. In an exemplary case, the LPF can be 5 to 10 MHz in bandwidth. In other words, the LPF can pass low frequency signals from DC to about 5 or 10 MHz and significantly attenuate higher frequencies.

The RX can be autocalibrated after the TX is autocalibrated. There are two main steps to isolate and eliminate the impairments due to the receiver's I-Q imbalance. First, the RX can receive a bandpass test signal from either a single frequency oscillator or the loop-back signal from the autocalibrated TX. Second, the receiver can process the signal using both I and Q paths, If the SSB signal is from the looped-back, autocalibrated TX signal, then the TX input can be a tone at a given frequency such as $F_{BB}$. The tone input to the TX can be pre-distorted as described below to ensure transmission is SSB; this can complete the TX autocalibration and enable the RX autocalibration.

The pre-distortion addresses the gain and the phase of the transmitter path in order to reduce the signal power at the image frequency, $F_C-F_{BB}$. The pre-distortion coefficients, can be digital adjustments to the TX input signal. Digital pre-distortion may be preferable when adjustment of the analog TX components is undesirable. Analog adjustments can require additional analog to digital converters (ADCs) and digital to analog converters (DACs), or can increase chip cost or reduce chip performance.

The single-path RX signal can contain information about transmitter LO leakage in addition to balancing the TX and suppressing the image. The TX autocalibration can set variables that both reduce the I-Q imbalance and correct LO leakage. The variables can be determined from frequency domain measurements of power at the image frequency, $F_{IF}-F_{BB}$, the intermediate frequency, $F_{IF}$, and the desired frequency, $F_{IF}+F_{BB}$.

A discrete Fourier transform (DFT) can implement the frequency domain measurements. Any number of samples and any references frequencies can be used to compute the DFT, however, a three-point DFT or a bank or array of digital filters can contain sufficient information to implement the system.

A DFT for a single reference frequency, i.e. a single point DFT, is the sum of the product of received ADC samples times a complex sinusoid, $\exp(i \cdot 2 \cdot \pi \cdot F_{ref} \cdot n \cdot T_S)$, where the reference frequency is $F_{ref}$, n is the number of the sample, and $T_S$ is the sampling period. If desired, the sum can be divided by the number of samples, N, to compute an average. The averaging time can be approximately $N \cdot T_S$. The DFT can implement a bank or array digital filters centered on the reference frequencies with a bandwidth of about $1/N \cdot T_S$.

A DFT can provide an estimate of a signal magnitude or amplitude and phase at a reference frequency. The DFT output has a phase that in relative to the reference frequency phase. If the reference frequency's phase is arbitrary, the DFT phase estimate may not be useful so the output may be reported as an amplitude only. The amplitude can be squared to provide an estimate of the signal power at the reference frequency.

A DFT can use three reference frequencies to determine the signal power at a lower sideband, the intermediate frequency, and an upper sideband. The lower sideband can be, for example, the image sideband, the upper sideband can be the desired signal, and the signal centered at the intermediate frequency can be the LO leakage. The three reference frequencies can be $F_{IF}-F_{BB}$, $F_{IF}$, and $F_{IF}+F_{BB}$. The DFT output power at $F_{IF}$ can allow the receiver to measure the TX LO leakage. The two DFTs, one at $F_{IF}-F_{BB}$ and one at $F_{IF}+F_{BB}$, can produce output power estimates that tell the receiver the TX gain and phase imbalance. The TX can be balanced when the power in the lower sideband is eliminated or its ratio to the upper sideband power is negligible. A three point DFT at $F_{IF}-F_{BB}$, $F_{IF}$, and $F_{IF}+F_{BB}$ can provide enough information to minimize both the LO leakage and I-Q imbalance.

The TX imbalance and LO leakage can be minimized by an adjuster algorithm or a minimization algorithm. In an exemplary case, the adjuster algorithm can be a blind algorithm. The algorithm can set variables to pre-distort and offset the TX's I and Q inputs. If a three point DFT shows either the LO leakage or I-Q imbalance is too high, then the algorithm can adjust the variables to values that reduce these impairments. The algorithm can be designed to converge rapidly and thus provide impairment minimizing values to the pre-distorter variables.

The adjuster algorithm can be initialized with the gain of the TX I path, $G_I$, the gain of the TX Q path, $G_Q$, and the phase of the Q path relative to the I-path. However, the TX may still have some residual phase imbalance so the calculated imbalance correction may be inexact. The adjuster algorithm can refine the $G_I$ and $G_Q$ variables and the phase imbalance variable. The refined estimates can compensate I-Q imbalance of the TX.

The adjuster algorithm can also reduce TX LO leakage by adjusting DC offsets at the input to the TX. The DC offset the TX I and Q inputs can be called $DC_I$, and $DC_Q$, respectively. The $DC_I$ and $DC_Q$ variables can reduce the power of the LO leakage during calibration.

The TX gain imbalance can be measured without calculating a DFT of the received samples. Instead of generating a tone simultaneously on the TX I and Q paths, each TX path can be tested separately. For example, starting with the TX I-path, first measure the power at the receiver. Second, transmit using only the TX Q-path and measure the power at the receiver. The power difference in power is due to the gain imbalance of the TX I and Q paths. The power difference can be nearly eliminated by adjusting the $G_I$ and $G_Q$ variables.

The I-Q phase imbalance can be found once the TX gain imbalance is known and the gain imbalance is corrected. The I-Q phase imbalance can be found by applying a single frequency calibration signal. When the calibration signal is unconverted by $F_C$ then downconverted by $F_C$-$F_{IF}$, the downconverted signal can yield an image/desired power ratio signal that is approximately proportional to the phase imbalance. The proportional relationship can hold when the gain imbalance is pre-compensated by the pre-distorter.

In an imbalanced TX, a single frequency test signal can produce an image that has an amplitude that is proportional to I-Q imbalance. Specifically, the image amplitude can be proportional to the gain imbalance and the square of the gain imbalance and phase imbalance.

Both gain imbalance and phase imbalance may be unknown initially. It may be difficult to find all unknowns simultaneously, so the adjuster algorithm can converge slowly. Therefore instead of using a an search, LMS, blind, or adaptation algorithm to adjust the TX initially, the autocalibration program can measure the gain difference directly then use a single frequency test signal to determine the phase difference in the TX I and Q paths.

The calibrated transmitter can be used to calibrate the receiver. After the transmitter is calibrated, however, instead of using an IF frequency, the RX calibration can be performed around zero frequency (DC I.F.) using both paths of the transmitter and both paths of the receiver. The received analog signal can be digitized by two analog-to-digital converters (ADCs) that sample every $T_S$ seconds. Each digitized inphase and quadrature path sample pair can be combined to form a complex signal, i.e., a sequence of complex numbers. A complex signal can represent both positive and negative frequencies. The complex samples can constitute a vector that can spin counterclockwise for positive frequencies and clockwise for negative frequencies, If the pre-distortion TX signal unimpaired, then the calibrated TX can transmit an SSB signal at a frequency of $F_C+F_{BB}$. The image at $F_C-F_{BB}$ can be negligible when the TX signal is pre-distorted to nearly eliminate TX I-Q gain imbalance, phase imbalance and TX LO leakage. When the TX signal is SSB, any significant remaining I-Q imbalance may be ascribed to the receiver.

The receiver imbalance can show up as power at the image frequency. The RX image power can be proportional to both the RX gain imbalance and phase imbalance. The receiver can process an SSB signal to find the RX gain and phase imbalance, or I-Q imbalance, and the RX LO leakage. When both TX paths are used in the upconversion, the upconverted test signal can be SSB.

Like the TX, the receiver's gain imbalance can be measured sequentially for the RX I-path and Q-path. The autocalibration algorithm can reduce the difference in RX I path and Q path gain by sealing the RX I path signal by the ratio of the Q path power to I path power. In general, $G_I/G_Q=\text{sqrt}(P_Q/P_I)$, where sqrt is the square root operator. The square root can be used because the gain coefficients. $G_I$ and $G_Q$ scale the signal amplitude, not the signal power. The inphase and quadrature power, $P_I$ and $P_Q$, respectively, can be measured at the test frequency, $F_{BB}$.

Once the RX gain imbalance is known, the remaining RX imbalance can be due to RX I and Q path phase imbalance. The RX image at $F_{BB}$ can provide a measurement of RX phase imbalance. The RX post-distorter can reduce the RX phase imbalance by minimizing the ratio of power in the image to power in the desired signal. In an exemplary case, the desired signal can be the signal at $+F_{BB}$ and the image can be at $-F_{BB}$.

In an exemplary case, the PLL can be re-used to provide an SSB signal to the receiver instead of the calibrated TX. The PLL can provide an alternative on-chip signal source because it can generate a signal that has nearly all of its power at a single frequency. In this case, the calibrated TX signal is not looped back to the RX when the PLL signal is re-used for RX autocalibration.

While the invention has been described in conjunction with the specific embodiments thereof, it is evident that many alternatives, modifications, and variations will be apparent to those skilled in the art. Accordingly, embodiments of the invention as set forth herein are intended to be illustrative, not limiting, There are changes that may be made without departing from the spirit and scope the invention.

What is claimed is:

1. A method, comprising:
   looping back a first signal to a first receiver;
   bypassing one of a first path and a second path of the first receiver;
   processing the first signal to form a second signal;
   injecting a third signal to a second receiver, the third signal being generated based on at least one of the second signal and a fourth signal.

2. The method of claim 1, wherein the third signal is generated based on at least one of the fourth signal and a fifth signal, the fifth signal being generated based on the second signal.

3. The method of claim 2, further comprising:
   adjusting a transmitter based on the second signal to generate the fifth signal.

4. The method of claim 1, further comprising:
   processing the third signal in the second receiver to form a sixth signal; and
   adjusting the second receiver based on the sixth signal to generate a seventh signal.

5. The method of claim 1, further comprising:
   upconverting a bandpass input signal by mixing the bandpass input signal with a signal of a first local oscillator to form the first signal.

6. The method of claim 5, wherein the first local oscillator is at least one of an on-chip voltage controlled oscillator and a phase locked loop.

7. The method of claim 5, wherein processing the first signal further comprises downconverting the first signal with a signal of a second local oscillator having a frequency that is different from the first local oscillator.

8. The method of claim 5, further comprising:
downconverting the third signal by using the third signal with the first local oscillator.

9. The method of claim 3, wherein adjusting the transmitter further comprises adjusting at least one of a gain and a phase of the transmitter based on a transmitter image sideband of the second signal.

10. The method of claim 9, further comprising:
separating the transmitter image sideband from the second signal;
separating a transmitter desired signal from the second signal; and
minimizing a power ratio of the transmitter image sideband to the transmitter desired signal.

11. A device, comprising:
is first circuit configured to route a first signal to a receiver;
a switch configured to bypass one of a first path and a second path of the receiver;
the receiver configured to process the first signal to form a second signal; and
a selector configured to inject a third signal into a second receiver, the third signal being generated based on at least one of the second signal and a fourth signal.

12. The device of claim 11, wherein the third signal is generated based on at least one of the fourth signal and a fifth signal, the fifth signal being generated based on the second signal.

13. The device of claim 12, further comprising:
a second circuit configured to adjust a transmitter based on the second signal to generate the fifth signal.

14. The device of claim 11, further comprising:
the second receiver configured to process the third signal to form a sixth signal; and
a third circuit configured to adjust the second receiver based on the sixth signal to generate a seventh signal.

15. The device of claim 11, further comprising:
a processor configured to form the first signal and to upconvert a bandpass input signal by mixing the bandpass input signal with is signal of a first local oscillator.

16. The device of claim 15, wherein the first local oscillator is at least one of an on-chip voltage controlled oscillator and is phase locked loop.

17. The device of claim 15, wherein the receiver is further configured to downconvert the first signal with a signal of a second local oscillator having a frequency that is different from the first local oscillator.

18. The device of claim 15, wherein the second receiver is further configured in downconvert the third signal by using the third signal with the first local oscillator.

19. The device of claim 13, wherein the second circuit is further configured to adjust at least one of a gain and a phase of the transmitter based on a transmitter image sideband of the second signal.

20. The device of claim 19, further comprising:
a first filter configured to separate the transmitter image sideband from the second signal;
a second filter configured to separate a transmitter desired signal from the second signal; and
a minimizer configured to minimize a power ratio of the transmitter image sideband to the transmitter desired signal.

* * * * *